(12) United States Patent
Myoung et al.

(10) Patent No.: US 11,938,493 B2
(45) Date of Patent: Mar. 26, 2024

(54) APPARATUS FOR PROCESSING SUBSTRATE AND OPERATING METHOD THEREOF

(71) Applicant: SEMES CO., LTD., Chungcheongnam-do (KR)

(72) Inventors: Noh Hoon Myoung, Seoul (KR); Han Seon Kang, Gyeonggi-do (KR); Jung Min Yoon, Daegu (KR)

(73) Assignee: Semes Co., Ltd., Chungcheongnam-do (KR)

( * ) Notice: Subject to any disclaimer, the term of this patent is extended or adjusted under 35 U.S.C. 154(b) by 837 days.

(21) Appl. No.: 16/985,535

(22) Filed: Aug. 5, 2020

(65) Prior Publication Data
US 2021/0039119 A1  Feb. 11, 2021

(30) Foreign Application Priority Data

Aug. 7, 2019 (KR) .................. 10-2019-0095884

(51) Int. Cl.
*B05B 1/34* (2006.01)
*B05B 3/00* (2006.01)
(Continued)

(52) U.S. Cl.
CPC ............ *B05B 1/3402* (2018.08); *B05B 3/006* (2013.01); *B05B 12/08* (2013.01); *B05B 12/124* (2013.01);
(Continued)

(58) Field of Classification Search
CPC ..... B05B 1/3402; B05B 3/006; B05B 12/124; B05B 12/08; B05B 13/0405;
(Continued)

(56) References Cited

U.S. PATENT DOCUMENTS 6,474,538 B1    11/2002  Yonezawa et al.
6,827,782 B2 *  12/2004  Goto ................... H01L 21/6715
                                                       118/667

(Continued)

FOREIGN PATENT DOCUMENTS

JP    2010248584 A      11/2010
KR   2019940017928 U    7/1994
(Continued)

OTHER PUBLICATIONS

Korean Grant of Patent issued in Korean Application No. 10-2019-0095884, dated Jun. 8, 2021 with translation, 3 pages.

*Primary Examiner* — Matthew W Jellett
*Assistant Examiner* — Christopher D Ballman
(74) *Attorney, Agent, or Firm* — RatnerPrestia

(57) ABSTRACT

Provided is a substrate processing apparatus. The substrate processing apparatus includes a swing nozzle that is arranged on one side of the support module, moves in a swing manner, and sprays a chemical solution to the substrate, a sensor arranged on one side of the swing nozzle to sense movement of the swing nozzle, an electromagnet and a magnet installed on the other side of the swing nozzle so as to be able to adjust spacing relative to each other, and a controller for receiving a sensing result of the sensor and performing a damping operation to the swing nozzle by providing power to the electromagnet to generate an attractive force or repulsive force between the electromagnet and the magnet.

17 Claims, 10 Drawing Sheets

(51) Int. Cl.
*B05B 12/08* (2006.01)
*B05B 12/12* (2006.01)
*B05B 13/04* (2006.01)
*B05B 14/40* (2018.01)
*B05B 16/60* (2018.01)
*H01L 21/67* (2006.01)
*H01L 21/68* (2006.01)

(52) U.S. Cl.
CPC ....... *B05B 13/0405* (2013.01); *B05B 13/0442* (2013.01); *B05B 14/40* (2018.02); *B05B 16/60* (2018.02); *H01L 21/67051* (2013.01); *H01L 21/6715* (2013.01); *H01L 21/67253* (2013.01); *H01L 21/67259* (2013.01); *H01L 21/68* (2013.01)

(58) Field of Classification Search
CPC ..... B05B 13/0442; B05B 14/40; B05B 16/60; H01L 21/67051; H01L 21/67259; H01L 21/68; H01L 21/6715; H01L 21/67253
See application file for complete search history.

(56) References Cited

U.S. PATENT DOCUMENTS

| | | | |
|---|---|---|---|
| 8,598,538 | B2 | 12/2013 | Aoki |
| 10,133,186 | B2* | 11/2018 | Schipper ................. G03F 7/707 |
| 10,727,090 | B2* | 7/2020 | Kikumoto ......... H01L 21/68742 |
| 11,009,798 | B2* | 5/2021 | Mirin .................... G01R 33/072 |
| 2006/0284434 | A1* | 12/2006 | Yang .................... B65G 49/061 |
| | | | 294/119.1 |
| 2011/0174991 | A1* | 7/2011 | Hui ......................... H01J 37/20 |
| | | | 250/492.21 |
| 2021/0335640 | A1* | 10/2021 | Heymanns ........ H01L 21/68785 |

FOREIGN PATENT DOCUMENTS

| | | |
|---|---|---|
| KR | 100734278 B1 | 7/2007 |
| KR | 1020080082152 A | 9/2008 |
| KR | 101911721 B1 | 10/2018 |

* cited by examiner

APPARATUS FOR PROCESSING SUBSTRATE AND OPERATING METHOD THEREOF

CROSS-REFERENCE TO RELATED APPLICATIONS

This patent application claims the benefit of Korean Patent Application No. 10-2019-0095884, filed on Aug. 7, 2019, which is hereby incorporated by reference in its entirety into this application.

BACKGROUND

1. Field

The present invention relates to an apparatus for processing a substrate and an operating method thereof.

2. Description of the Related Art

When manufacturing a semiconductor device or a display device, various processes such as photography, etching, ashing, ion implantation, thin film deposition and cleaning are performed. Here, the cleaning process removes contaminants such as particles, organic contaminants, and metal contaminants remaining on the substrate surface. The cleaning process is divided into dry cleaning and wet cleaning. Wet cleaning is divided into a bathing type of bathing the substrate in a chemical solution to remove contaminants by chemical dissolution, etc., and a single wafer type of placing the substrate on a spin chuck and supplying a chemical solution to the surface of the substrate through a nozzle while rotating the substrate to remove contaminants.

SUMMARY

On the other hand, in the case of the single wafer type cleaning device, due to the vibration of the nozzle for supplying the chemical solution, it is difficult to optimize yield and process. When the nozzle vibrates, the chemical solution in the nozzle may be sprayed on the substrate more than a predetermined value. Accordingly, a problem that some patterns of the substrate collapse may occur.

The problem to be solved by the present invention is to provide a substrate processing apparatus including a damper capable of minimizing the vibration of the nozzle.

Another problem to be solved by the present invention is to provide a method for operating a substrate processing apparatus including a damper capable of minimizing vibration of a nozzle.

The problems of the present invention are not limited to the problems mentioned above, and other problems not mentioned will be clearly understood by those skilled in the art from the following description.

One aspect of the substrate processing apparatus of the present invention for achieving the above object comprises a support module that supports a substrate and is swingable; a swing nozzle that is arranged on one side of the support module, moves in a swing manner, and sprays a chemical solution to the substrate; a sensor arranged on one side of the swing nozzle to sense movement of the swing nozzle; an electromagnet and a magnet installed on the other side of the swing nozzle so as to be able to adjust spacing relative to each other; and a controller for receiving a sensing result of the sensor and performing a damping operation to the swing nozzle by providing power to the electromagnet to generate an attractive force or repulsive force between the electromagnet and the magnet.

The electromagnet is connected to the other side of the swing nozzle through a first spring, and the magnet is connected to the other side of the swing nozzle through a second spring.

A distance between the electromagnet and the magnet decreases as the first spring or the second spring is bent when an attractive force is generated between the electromagnet and the magnet, and a distance between the electromagnet and the magnet increases as the first spring or the second spring is bent when a repulsive force is generated between the electromagnet and the magnet.

The sensor is an acceleration sensor, and the controller may control at least one of a frequency and an amplitude of a current provided to the electromagnet based on the acceleration sensed by the acceleration sensor.

A repulsive force between the electromagnet and the magnet may be increased as an absolute value of an acceleration sensed by the acceleration sensor increases.

A first size of vibration may occur in the swing nozzle when the swing nozzle moves at a constant speed, and a second size of vibration larger than the first size may occur in the swing nozzle when the swing nozzle stops.

The swing nozzle moves from a first position to a second position while spraying a chemical solution to the substrate, and the first position corresponds to an edge of the substrate, the second position corresponds to a center of the substrate, and the swing nozzle may stop at least twice between the first position and the second position.

A nozzle tip is arranged on the one side of the swing nozzle, the other side of the swing nozzle is connected to the nozzle shaft, the nozzle shaft is connected to a first pulley, a motor is connected to a second pulley, and the first pulley and the second pulley may be connected by a timing belt.

The first electromagnet may comprise a voice coil motor.

Another aspect of the substrate processing apparatus of the present invention for achieving the above object comprises a swing nozzle for spraying a chemical solution to a substrate; an acceleration sensor arranged on one side of the swing nozzle; and a damper that is arranged on the other side of the swing nozzle, and performs a damping operation according to an acceleration sensed by the acceleration sensor, wherein the damper comprises an electromagnet connected to the other side of the swing nozzle through a first spring and a magnet connected to the other side of the swing nozzle through a second spring and arranged to face the electromagnet.

A distance between the electromagnet and the magnet decreases as the first spring or the second spring is bent, thereby reducing a damping amount of the damper when an attractive force is generated between the electromagnet and the magnet, and a distance between the electromagnet and the magnet increases as the first spring or the second spring is bent, thereby increasing a damping amount of the damper when a repulsive force is generated between the electromagnet and the magnet.

A first size of vibration occurs in the swing nozzle when the swing nozzle moves at a constant speed, and a second size of vibration larger than the first size occurs in the swing nozzle when the swing nozzle stops.

The swing nozzle moves from a first position to a second position while spraying a chemical solution to the substrate, the first position corresponds to an edge of the substrate, the second position corresponds to a center of the substrate, and the swing nozzle stops at least twice between the first position and the second position.

One aspect of the method for operating a substrate processing apparatus of the present invention for achieving the other object comprises providing a substrate processing apparatus including a swing nozzle, an acceleration sensor arranged on one side of the swing nozzle to sense movement of the swing nozzle, an electromagnet connected to the other side of the swing nozzle through a first spring, and a magnet connected to the other side of the swing nozzle through a second spring and arranged to face the electromagnet, sensing a vibration of the swing nozzle through the acceleration sensor, and generating a repulsive force between the electromagnet and the magnet to increase a distance between the electromagnet and the magnet according to a sensing result of the acceleration sensor.

A first size of vibration occurs in the swing nozzle when the swing nozzle moves at a constant speed, and a second size of vibration larger than the first size occurs in the swing nozzle when the swing nozzle stops.

The swing nozzle moves from a first position to a second position while spraying a chemical solution to the substrate, the first position corresponds to an edge of the substrate, the second position corresponds to a center of the substrate, and the swing nozzle stops at least twice between the first position and the second position.

Details of other embodiments are included in the detailed description and drawings.

DETAILED DESCRIPTION

Figure 1:
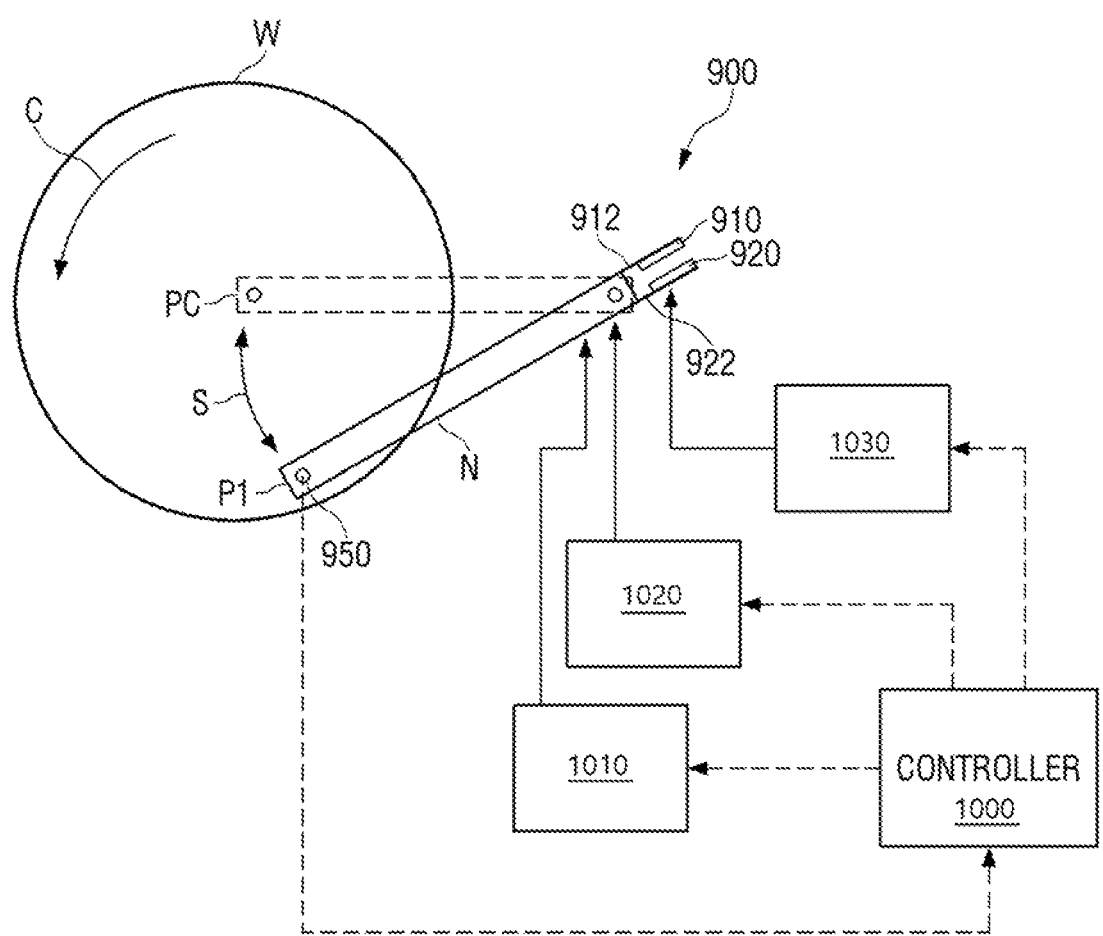
FIG. 1 is a block diagram for describing a substrate processing apparatus according to an embodiment of the present invention.

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same components throughout the specification.

When elements or layers are referred to as "on" or "above" of other elements or layers, it includes not only when directly above of the other elements or layers, but also other layer or other element intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of an element or components with other elements or components. The spatially relative terms should be understood as terms including the different direction of the element in use or operation in addition to the direction shown in the drawing. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various elements, components and/or sections, these elements, components and/or sections are not limited by these terms. These terms are only used to distinguish one element, component or section from another element, component or section. Therefore, the first element, first component or first section mentioned below may be a second element, second component or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the components, steps, operations and/or elements mentioned above do not exclude the presence or additions of one or more other components, steps, operations and/or elements.

Unless otherwise defined, all terms (including technical and scientific terms) used in the present specification may be used as meanings commonly understood by those skilled in the art, to which the present invention pertains. In addition, terms defined in the commonly used dictionary are not ideally or excessively interpreted unless specifically defined.

Hereinafter, exemplary embodiments of the present invention will be described in detail with reference to the accompanying drawings, and in the description with reference to the accompanying drawings, the same or corresponding components are assigned the same reference numbers regardless of reference numerals, and the description overlapped therewith will be omitted.

Figure 2:
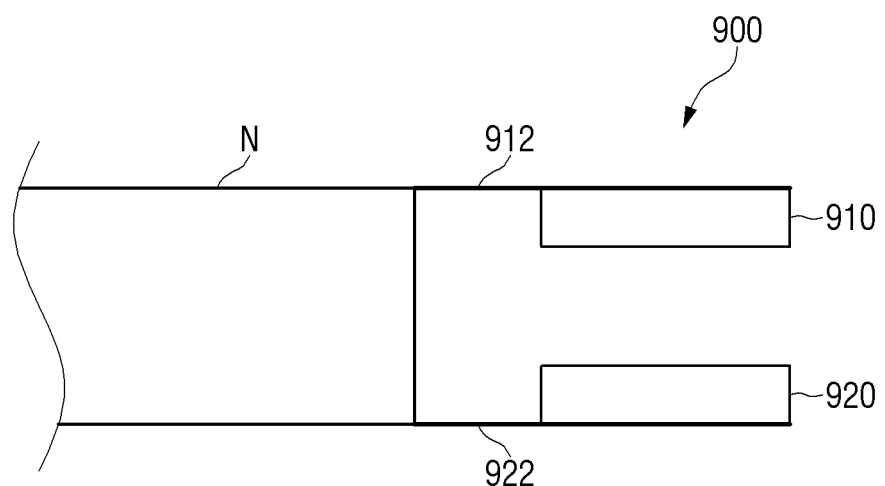
FIG. 2 is an enlarged view for describing a damper shown in FIG. 1.
Figure 3:
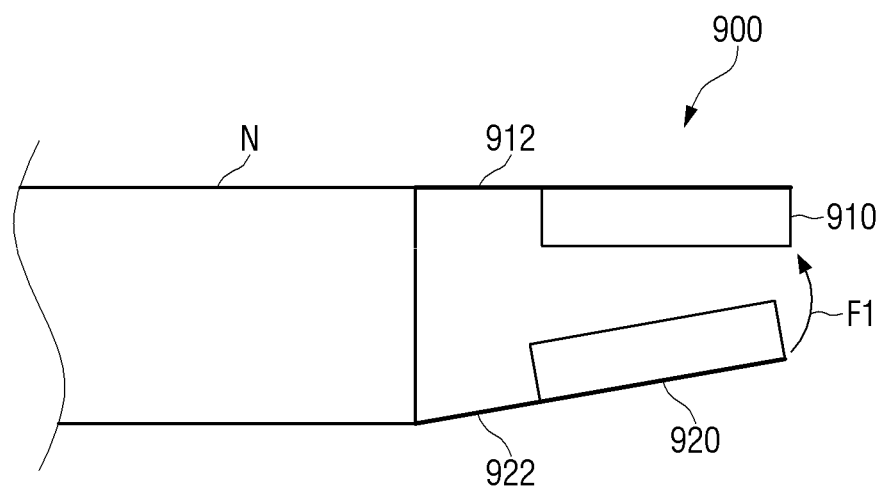
FIGS. 3 and 4 are diagrams for describing the operation of the damper shown in FIG. 1.
Figure 4:
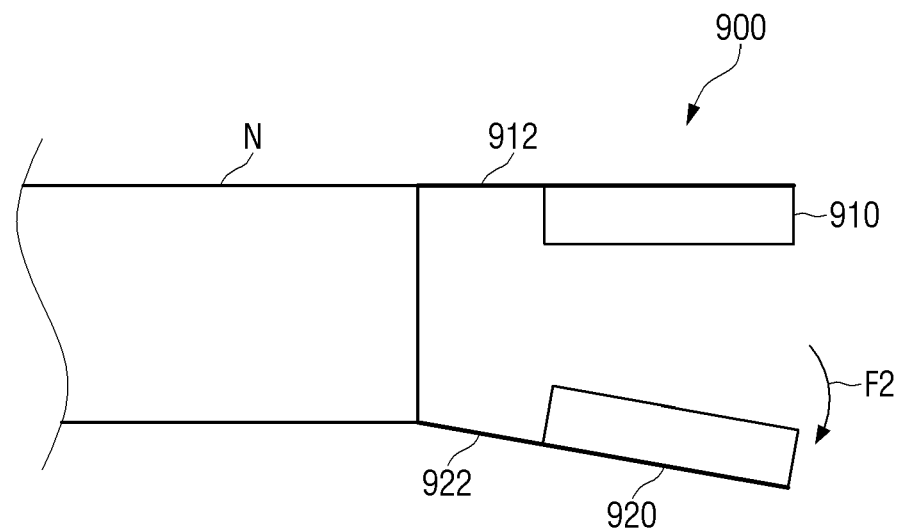

FIG. 1 is a block diagram for describing a substrate processing apparatus according to an embodiment of the present invention. FIG. 2 is an enlarged view for describing the damper illustrated in FIG. 1. FIGS. 3 and 4 are diagrams for describing the operation of the damper shown in FIG. 1.

Referring first to FIG. 1, a substrate processing apparatus according to an embodiment of the present invention includes a swing nozzle N, a sensor 950, a damper 900, a controller 1000, and the like.

The substrate W is located on the support module, and the support module may rotate the substrate W in one direction C.

The swing nozzle N moves in a swing method S, and sprays a chemical solution to the substrate W. That is, while the substrate W rotates, the swing nozzle N may move from the first position P1 to the second position PC while spraying the chemical solution to the substrate W. For example, the first position P1 may correspond to the edge of the substrate W, and the second position PC may correspond to the center of the substrate.

In addition, a nozzle tip is arranged on one side of the swing nozzle N, and the other side of the swing nozzle N is connected to the nozzle shaft. The swing nozzle N swings based on the nozzle shaft.

The swing nozzle N is connected to the chemical solution supplying unit 1010 and is connected to the driving unit 1020. The swing nozzle N is supplied with power by the driving unit 1020 to perform a swing operation, and receives the chemical solution from the chemical solution supplying unit 1010 to spray the chemical solution through the nozzle tip. The chemical solution may be a chemical solution used for cleaning the substrate (for example, ultrapure water, ozone water, isopropyl alcohol, etc.), but is not limited thereto.

The sensor 950 is arranged on one side of the swing nozzle N, and senses the movement of the swing nozzle N. The sensor 950 may be, for example, an acceleration sensor, but is not limited thereto. That is, any sensor can be used as long as it can sense the movement (e.g., vibration) of the swing nozzle N. The sensor 950 provides a sensing result (e.g., acceleration of the swing nozzle N) to the controller 1000.

Further, a damper 900 is installed on the other side of the swing nozzle N.

Referring to FIG. 2, the damper 900 may include an electromagnet 910 and a magnet 920, which are installed so as to be able to adjust relative spacing relative to each other. The electromagnet 910 is connected to the other side of the swing nozzle N through the first spring 912, and the magnet 920 is connected to the other side of the swing nozzle N through the second spring 922 so that the relative spacing can be adjusted relative to each other. For example, the first spring 912 and the second spring 922 may be plate springs, but are not limited thereto. That is, as long as the electromagnet 910 and the magnet 920 are arranged to face each other, and the relative spacing between the first spring 912 and the second spring 922 can be adjusted, anything is possible.

The electromagnet 910 receives power (e.g., current) from the power supplying unit 1030. Depending on the frequency/amplitude of the received power, the form of magnetic force generated by the electromagnet 910 is changed.

The electromagnet 910 may be, for example, a voice coil motor (VCM). The voice coil motor can be used for precise control because of its fast response, linearity, and low-power driving in a compact size. The voice coil motor may have, for example, a structure in which a magnetic circuit is formed of a soft magnetic material and a permanent magnet, and a coil is located in an airgap in the magnetic circuit.

The magnet 920 may be an electromagnet or a permanent magnet. If the magnet 920 is an electromagnet, power may be provided from the power supplying unit 1030. Hereinafter, for convenience of description, it will be described as a case where the magnet 920 is a permanent magnet.

The controller 1000 may receive the sensing result of the sensor 950 (for example, the acceleration of the swing nozzle N), and perform a damping operation for the swing nozzle N by providing power to the electromagnet 910 from the power supplying unit 1030 based on the sensing result to generate an attractive force or repulsive force between the electromagnet 910 and the magnet 920.

Referring to FIG. 3, when the attractive force F1 is generated between the electromagnet 910 and the magnet 920, the first spring 912 or the second spring 922 is bent and the distance between the electromagnet 910 and the magnet 920 decreases. As the distance between the electromagnet 910 and the magnet 920 decreases, the damping amount of the damper 900 decreases.

Referring to FIG. 4, when the repulsive force F2 is generated between the electromagnet 910 and the magnet 920, the first spring 912 or the second spring 922 is bent and the distance between the electromagnet 910 and the magnet 920 increases. As the distance between the electromagnet 910 and the magnet 920 increases, the damping amount of the damper 900 increases. When the swing nozzle N vibrates, the damping amount may be increased to weaken the vibration of the swing nozzle N.

Here, the strengths of the first spring (plate spring) 912 and the second spring (plate spring) 922 may be different. In consideration of the arrangement of other modules (or components) in the chamber, the strength of the first spring 912/second spring 922 is adjusted. As shown in FIGS. 3 and 4, the strength of the first spring 912 may be greater than that of the second spring 922. In this way, when the attractive/repulsive force is generated, the second spring 922 is more bent than the first spring 912. Conversely, unlike those shown in FIGS. 3 and 4, the strength of the second spring 922 may be greater than that of the first spring 912.

Figure 5:
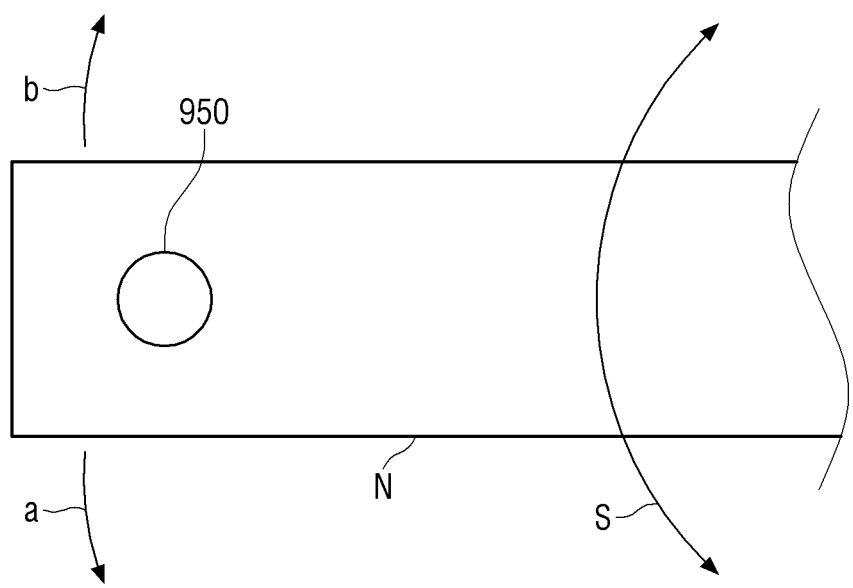
FIG. 5 is an enlarged view for describing one side of the swing nozzle shown in FIG. 1.
Figure 6:
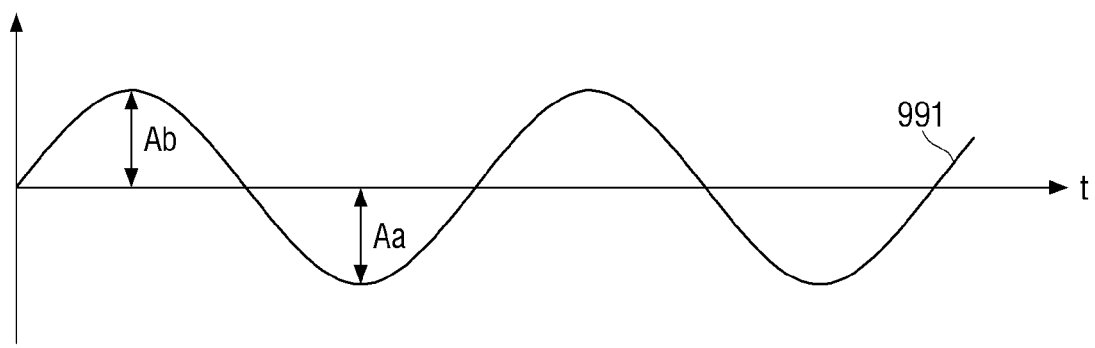
FIG. 6 is a diagram for describing the vibration generated when the swing nozzle moves at a constant speed.
Figure 7:
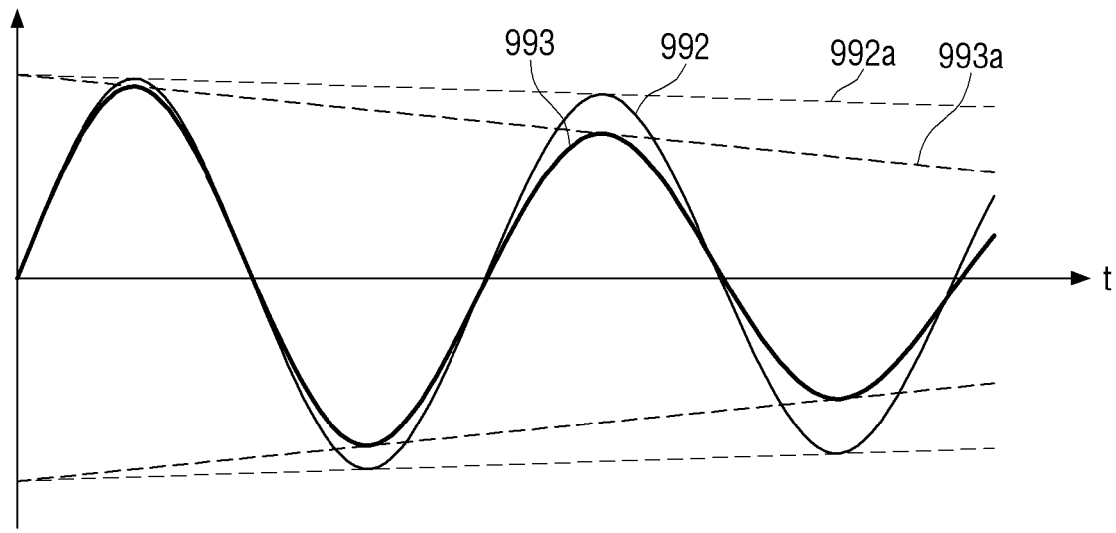
FIG. 7 is a diagram for describing the vibration generated when the swing nozzle stops.

Referring to FIGS. 5 to 7, the damping operation of the damper 900 will be further described.

FIG. 5 is an enlarged view for describing one side of the swing nozzle shown in FIG. 1. FIG. 6 is a diagram for describing the vibration generated when the swing nozzle moves at a constant speed. FIG. 7 is a diagram for describing the vibration generated when the swing nozzle stops.

First, referring to FIG. 5, in order to provide a constant chemical solution on the substrate W, the controller 1000 controls the swing nozzle N to move at a constant speed. The swing nozzle N is provided with a rotational force from the motor 770 through a timing belt and a pulley, and accordingly, the swing nozzle N can move. However, due to this structure, vibration may occur when the swing nozzle N operates. As shown in FIG. 5, one side of the swing nozzle N may vibrate in the first direction (a) and the second direction (b).

Referring to FIG. 6, the x-axis represents time and the y-axis represents displacement. Even if the swing nozzle N moves at a constant speed, the swing nozzle N generates minute vibrations (i.e., a first size of vibration) as shown in FIG. 6. Reference numeral 991 denotes vibration occurring at one side of the swing nozzle N during constant speed motion. FIG. 6 shows the amplitude (Ab) in the second direction (b) and the amplitude (Aa) in the first direction (a). By using the damper 900, the amplitudes (Aa, Ab) may be reduced.

Referring to FIG. 7, the x-axis represents time and the y-axis represents displacement. When the swing nozzle N stops, the swing nozzle N generates relatively large vibrations (i.e., a second size of vibration). Here, the second size may be larger than the first size. Here, the second size is the largest amplitude that occurs when stopping, and the first size indicates the largest amplitude that occurs during constant speed motion.

Reference numeral 992 denotes vibration occurring at one side of the swing nozzle N when stopping. For example, when the swing nozzle N moves in the second direction (b) and stops, inertia occurs in the second direction (b). Therefore, even if the controller 1000 tries to stop the swing nozzle N, the swing nozzle N moves slightly more in the second direction (b) than the stop target position. Thereafter, the swing nozzle N returns to the stop target position, and at this time, it also moves slightly more in the first direction (a) than the stop target position. As shown in FIG. 7, as a result, the swing nozzle N stops while vibrating. In this vibration process, the chemical solution in the swing nozzle N may be discharged on the substrate W. Therefore, it is necessary to minimize this vibration.

On the other hand, in the substrate processing apparatus according to an embodiment of the present invention, since the acceleration sensor 950 is installed on one side of the swing nozzle N, the damping force of the damper 900 is adjusted according to the sensing result. For example, as the absolute value of the acceleration sensed by the acceleration sensor 950 increases, the repulsive force between the electromagnet 910 and the magnet 920 is increased (that is, the damping force is increased). Therefore, it is possible to minimize the vibration of the swing nozzle N.

In FIG. 7, reference numeral 992 denotes, in the case that the damper 900 is not present (or when the damper 900 is not operated), vibration occurring at one side of the swing nozzle N when stopping. For example, the vibration of the swing nozzle N may be reduced along the tangent line 992*a*.

On the other hand, reference numeral 993 denotes, in the case that the damper 900 is operated, vibration occurring at one side of the swing nozzle N when stopping. For example, the vibration of the swing nozzle N may be reduced along the tangent line 993*a*. It can be seen that the slope of the tangent 993*a* is steeper than that of the tangent 992*a*. That is, when operating the damper 900, it is possible to minimize the vibration of the swing nozzle N when stopping.

According to the substrate processing apparatus according to an embodiment of the present invention, the vibration of the swing nozzle N can be known in real time through the acceleration sensor 950, and the damper is operated to minimize vibration (to eliminate vibration). Based on the sensing result of the acceleration sensor 950, the controller 1000 may adjust the frequency and/or amplitude of the current provided to the electromagnet 910 in real time.

By accurately matching the vibration of the swing nozzle N (that is, reference numerals 991 and 992), the controller 1000 may adjust the damping amount of the damper 900 complementarily.

Alternatively, if the damping amount of the damper 900 is not accurately/complementarily matched to the vibration of the swing nozzle N, and the acceleration of the acceleration sensor 950 is greater than a predetermined reference, a repulsive force may be generated between the electromagnet 910 and the magnet 920 to increase the distance between the electromagnet 910 and the magnet 920 (that is, to implement a predetermined damping amount or more).

Figure 8:
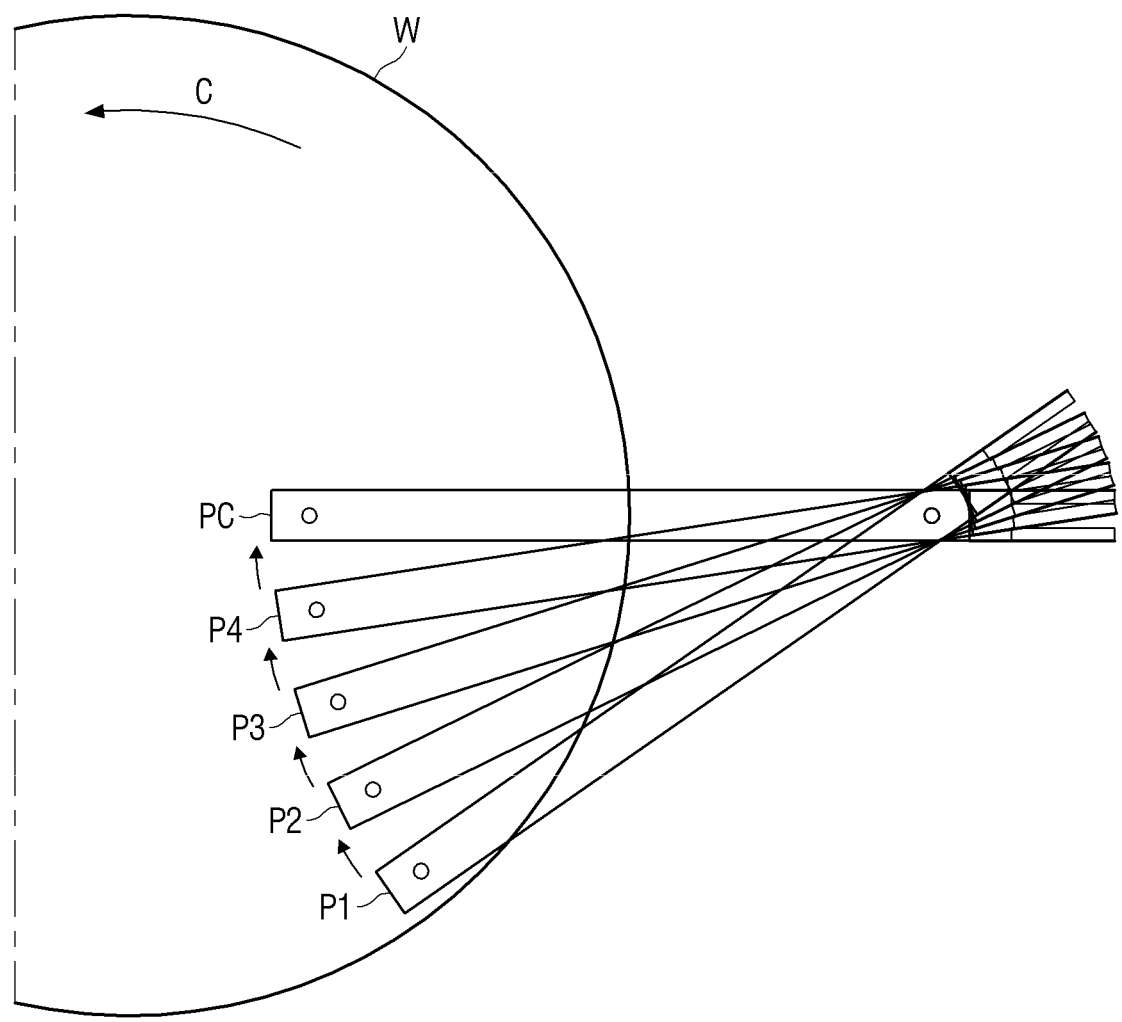
FIG. 8 is a diagram for describing a substrate processing apparatus according to another embodiment of the present invention.

FIG. 8 is a diagram for describing a substrate processing apparatus according to another embodiment of the present invention. For convenience of description, differences from those described with reference to FIGS. 1 to 7 will be mainly described.

Referring to FIG. 8, the swing nozzle N moves from the first position P1 to the second position PC while spraying the chemical solution to the substrate W, but the swing nozzle N may stop between the first position P1 and the second position PC at least twice. In FIG. 8, it may stop at positions P2, P3, and P4. The reason for stopping like this is as follows. A swing nozzle N is used to uniformly apply the chemical solution to the upper surface of the substrate (W), but since the relative movement direction of the substrate (W) and the swing nozzle (N) is different, a swing nozzle is stopped several times in the middle to implement a constant speed driving profile. In this way, as the number of times the swing nozzle N is stopped increases, the effect of the damping operation of the substrate processing apparatus of the present invention can be maximized.

Figure 9:
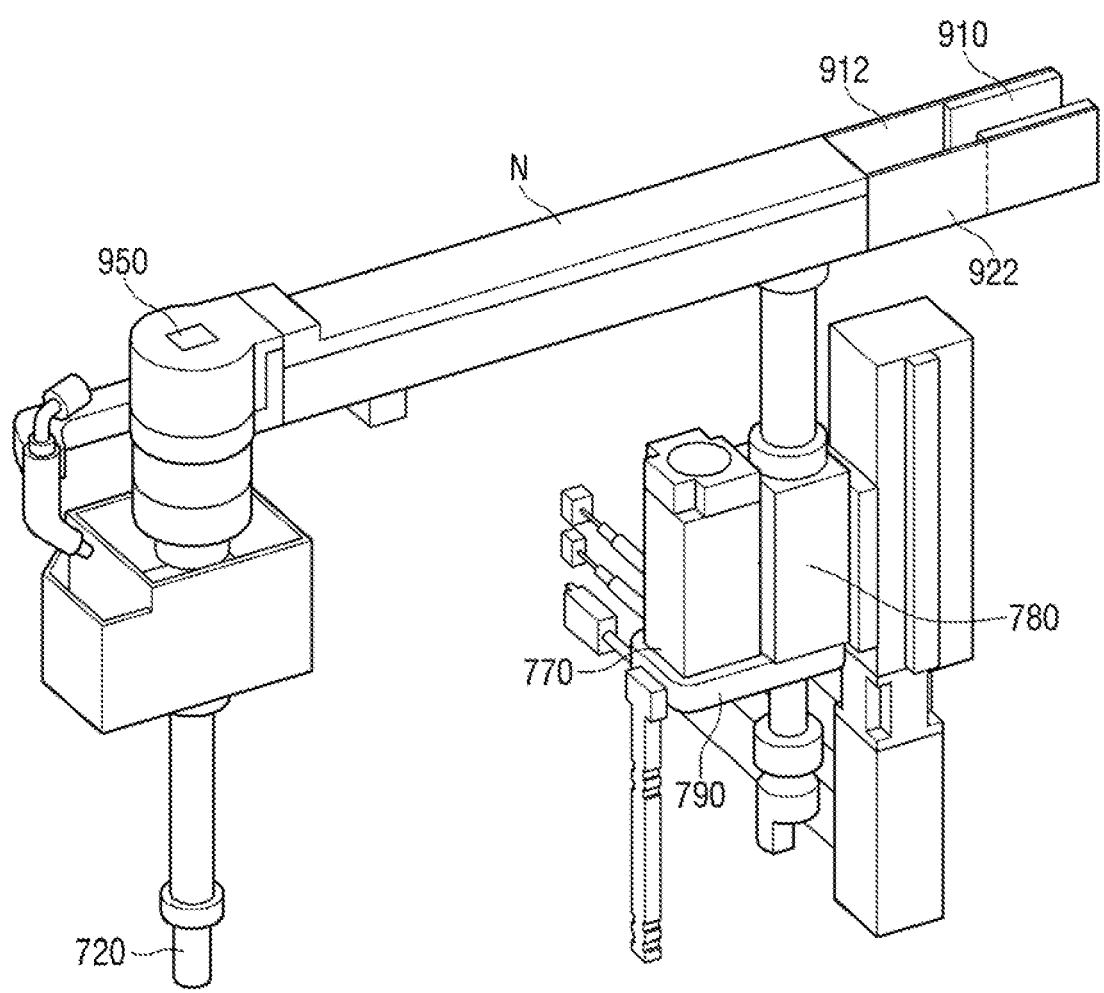
FIGS. 9 and 10 are diagrams for describing a substrate processing apparatus according to another embodiment of the present invention.
Figure 10:
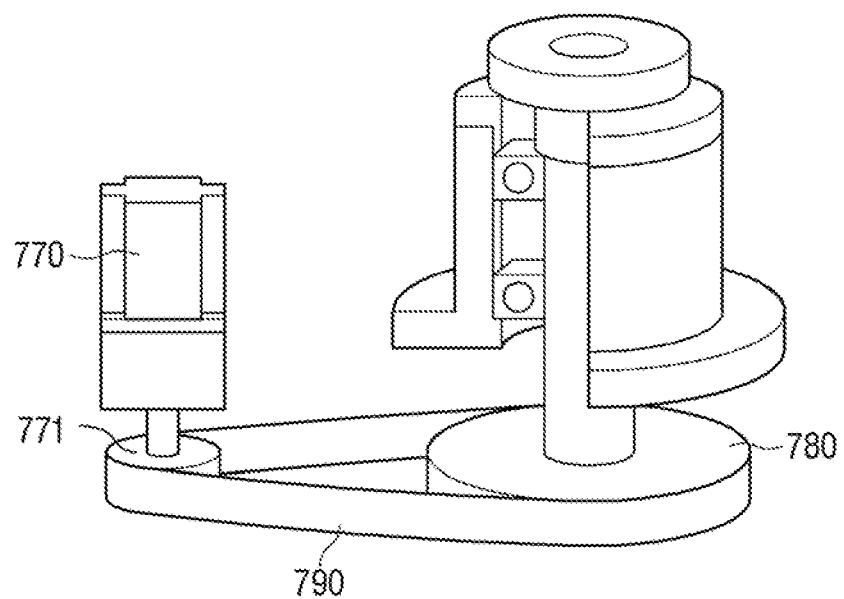

FIGS. 9 and 10 are diagrams for describing a substrate processing apparatus according to another embodiment of the present invention. FIG. 9 is an embodiment of the substrate processing apparatus described with reference to FIGS. 1 to 8, and FIG. 10 is a diagram for describing a relationship between a motor, a pulley, and a timing belt of FIG. 9.

Referring to FIGS. 9 and 10, the nozzle tip 720 is arranged on one side of the swing nozzle N. Further, a sensor 950 is installed on one upper surface of the swing nozzle N. A damper 900 (i.e., an electromagnet 910, a magnet 920, a first spring 912, a second spring 922, etc.) is installed on the other side of the swing nozzle N. Further, the other side of the swing nozzle N is connected to the nozzle shaft. The nozzle shaft is connected to the first pulley 780, the motor 770 is connected to the second pulley 771, and the first pulley 780 and the second pulley 771 are connected by a timing belt 790. The swing nozzle N is provided with a rotational force by the motor 770 through a second pulley 771, a timing belt 790, a first pulley 780, a nozzle shaft, and the like. However, due to this structure, vibration may occur when the swing nozzle N operates (i.e., during constant speed movement or when stopping). The controller 1000 senses the vibration of the swing nozzle N using the sensor 950 and drives the damper 900 to compensate for the vibration. The vibration is minimized in this way.

Figure 11:
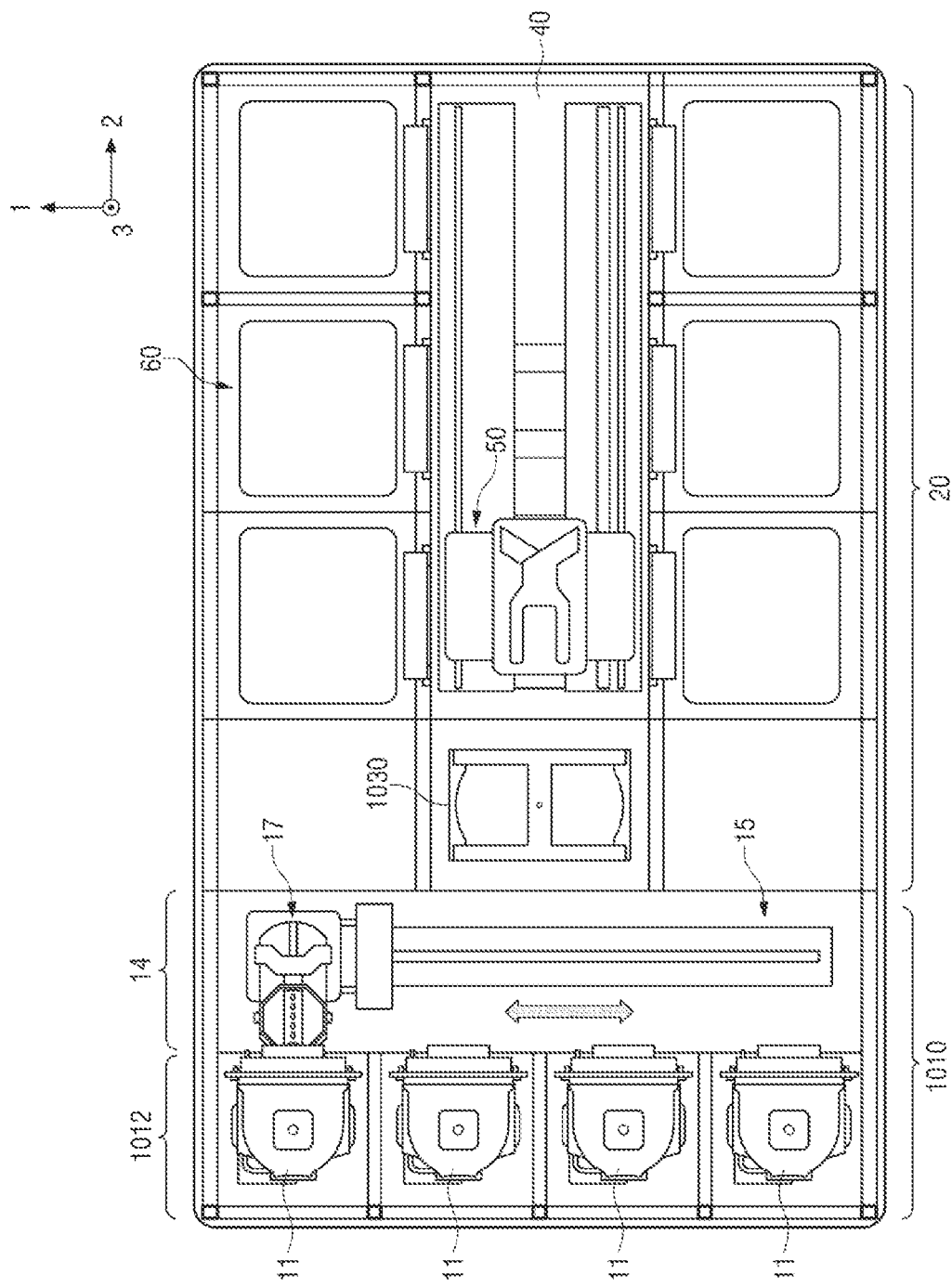
FIG. 11 is a plan view schematically illustrating a substrate processing system according to some embodiments of the present invention.

FIG. 11 is a plan view schematically illustrating a substrate processing system according to some embodiments of the present invention. It is a system, in which the substrate processing apparatus described with reference to FIGS. 1 to 10 can be implemented.

Referring to FIG. 11, the substrate processing system of the present invention may comprise an index unit 1010 and a process processing unit 20. The index unit 1010 and the process processing unit 20 are arranged in a line. Hereinafter, the direction, in which the index unit 1010 and the process processing unit 20 are arranged, is referred to as a second direction (2), and when viewed from the top, the vertical direction of the second direction (2) is the first direction (1). And, the direction perpendicular to the plane including the first direction (1) and the second direction (2) is defined as a third direction (3).

The index unit 1010 is arranged in front of the substrate processing system. The index unit 1010 includes a load port 1012 and a transport frame 14.

The carrier 11, in which the substrate W is stored, is seated on the load port 1012. A plurality of load ports 1012 are provided and they are arranged in a line along the first direction (1). The number of load ports 1012 may increase or decrease depending on the process efficiency of the substrate processing apparatus 1000 and footprint conditions. As the carrier 11, a Front Opening Unified Pod (FOUP) may be used. The carrier 11 is formed with a plurality of slots for storing substrates in a horizontal arrangement with respect to the ground.

The transport frame 14 is arranged in the second direction 2 adjacent to the load port 1012. The transport frame 14 is arranged between the load port 1012 and the buffer unit 1030 of the process processing unit 20. The transport frame 14 includes an index rail 15 and an index robot 17. The index robot 17 is seated on the index rail 15. The index robot 17 transports the substrate W between the buffer unit 1030 and the carrier 11. The index robot 17 moves linearly in the second direction along the index rail 15 or rotates in the third direction (3) as an axis.

The process processing unit 20 is arranged behind the substrate processing system along the second direction (2) adjacent to the index unit 1010. The process processing unit 20 includes a buffer unit 1030, a moving passage 40, a main transport robot 50 and a substrate processing device 60.

The buffer unit 1030 is arranged in front of the process processing unit 20 along the second direction 2. The buffer unit 1030 is a place where the substrate W is temporarily stored and waits before the substrate W is returned between the substrate processing device 60 and the carrier 11. The buffer unit 1030 is provided with a slot (not shown), in which the substrate W is placed, and a plurality of slots (not shown) are spaced apart from each other along the third direction (3).

The moving passage 40 is arranged to correspond to the buffer unit 1030. The moving passage 40 is arranged in parallel along the second direction (2) in its longitudinal direction. The moving passage 40 provides a passage, through which the main transport robot 50 moves. On both sides of the moving passage 40, the substrate processing devices 60 are arranged facing the each other and along the second direction (2). In the moving passage 40, the main transport robot 50 moves along the second direction (2), and a movable rail capable of moving up and down to the upper and lower layers of the substrate processing device 60 and the upper and lower layers of the buffer unit 1030 is installed.

The main transport robot 50 is installed in the moving passage 40 and transports the substrate W between the substrate processing device 60 and the buffer unit 1030 or between each substrate processing device 60. The main transport robot 50 linearly moves in the second direction (2) along the moving passage 40 or rotates in the third direction (3) as an axis.

A plurality of substrate processing devices 60 are provided, and are arranged on both sides around the moving passage 40 along the second direction 2. Some of the substrate processing devices 60 are arranged along the longitudinal direction of the moving passage 40. Further, some of the substrate processing devices 60 are arranged to be stacked with each other. That is, the substrate processing devices 60 may be arranged in an array of A×B on one side of the moving passage 40. Here, A is the number of the substrate processing devices 60 provided in a line along the first direction (1), and B is the number of the substrate processing devices 60 provided in a line along the second direction (2). When four or six substrate processing devices 60 are provided on one side of the moving passage 30, the substrate processing devices 60 may be arranged in an array of 2×2 or 3×2. The number of substrate processing devices 60 may increase or decrease. Unlike the above, the substrate processing devices 60 may be provided only on one side of the moving passage 40. Further, unlike the above, the substrate processing device 60 may be provided as a single layer on one side and both sides of the moving passage 40.

The substrate processing device 60 may perform a cleaning process to the substrate W. The substrate processing device 60 may have a different structure depending on the type of cleaning process to be performed. Alternatively, each substrate processing device 60 may have the same structure. Optionally, the substrate processing devices 60 are divided into a plurality of groups, and the substrate processing devices 60 belonging to the same group may be the same as each other, and structures of the substrate processing devices 60 belonging to different groups may be provided differently from each other. Optionally, at both sides of the transport chamber 240, a first group of substrate processing devices 60 may be provided on the lower layer, and a second group of substrate processing devices 60 may be provided on the upper layer. The first group of substrate processing device 60 and the second group of substrate processing device 60 may be divided according to the type of chemical used or the type of cleaning method. Alternatively, the first group of substrate processing device 60 and the second group of substrate processing device 60 may be provided to sequentially perform a process to one substrate W.

Figure 12:
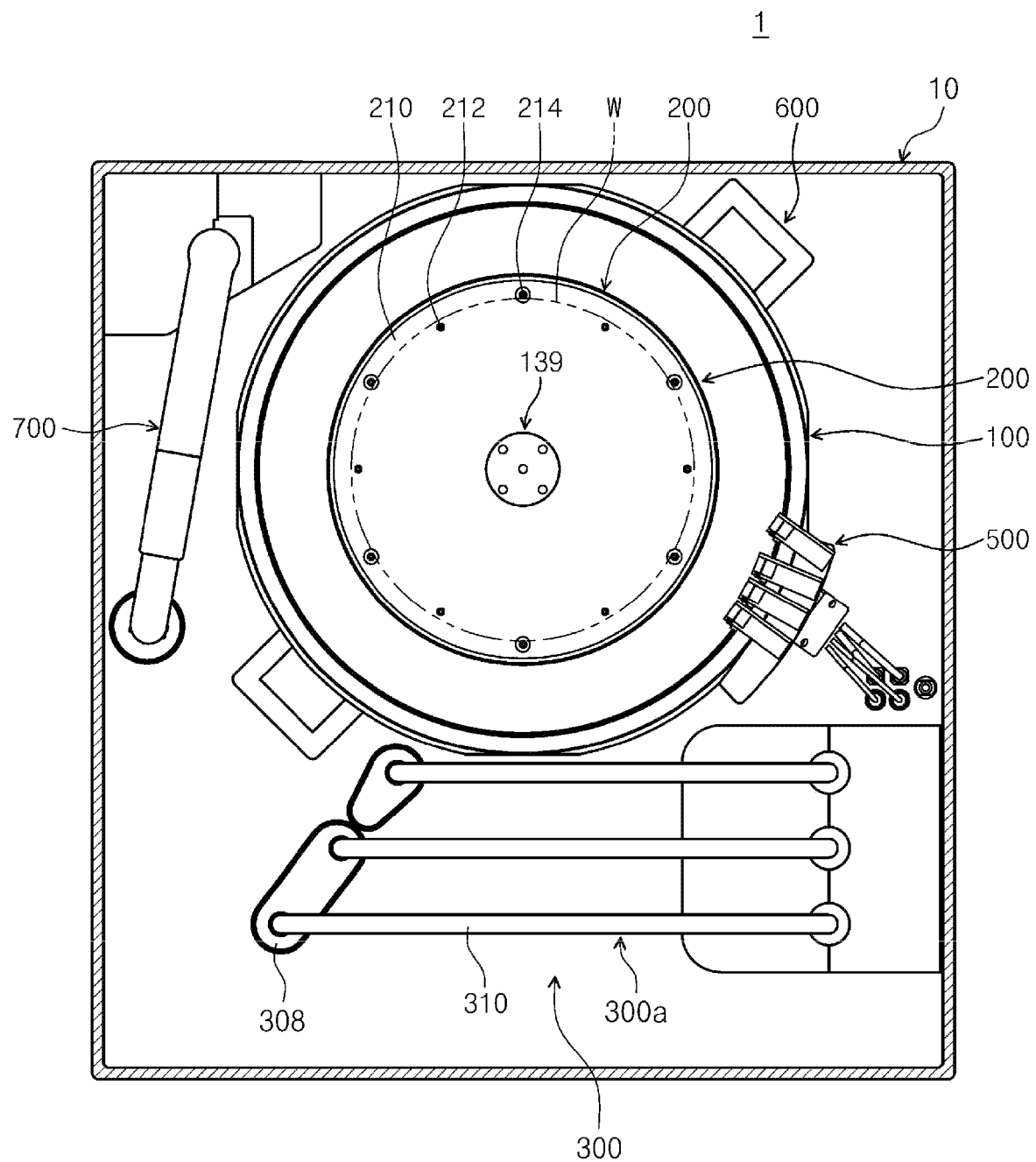
FIG. 12 is a plan block diagram showing the configuration of the single wafer type substrate processing apparatus of FIG. 11.
Figure 13:
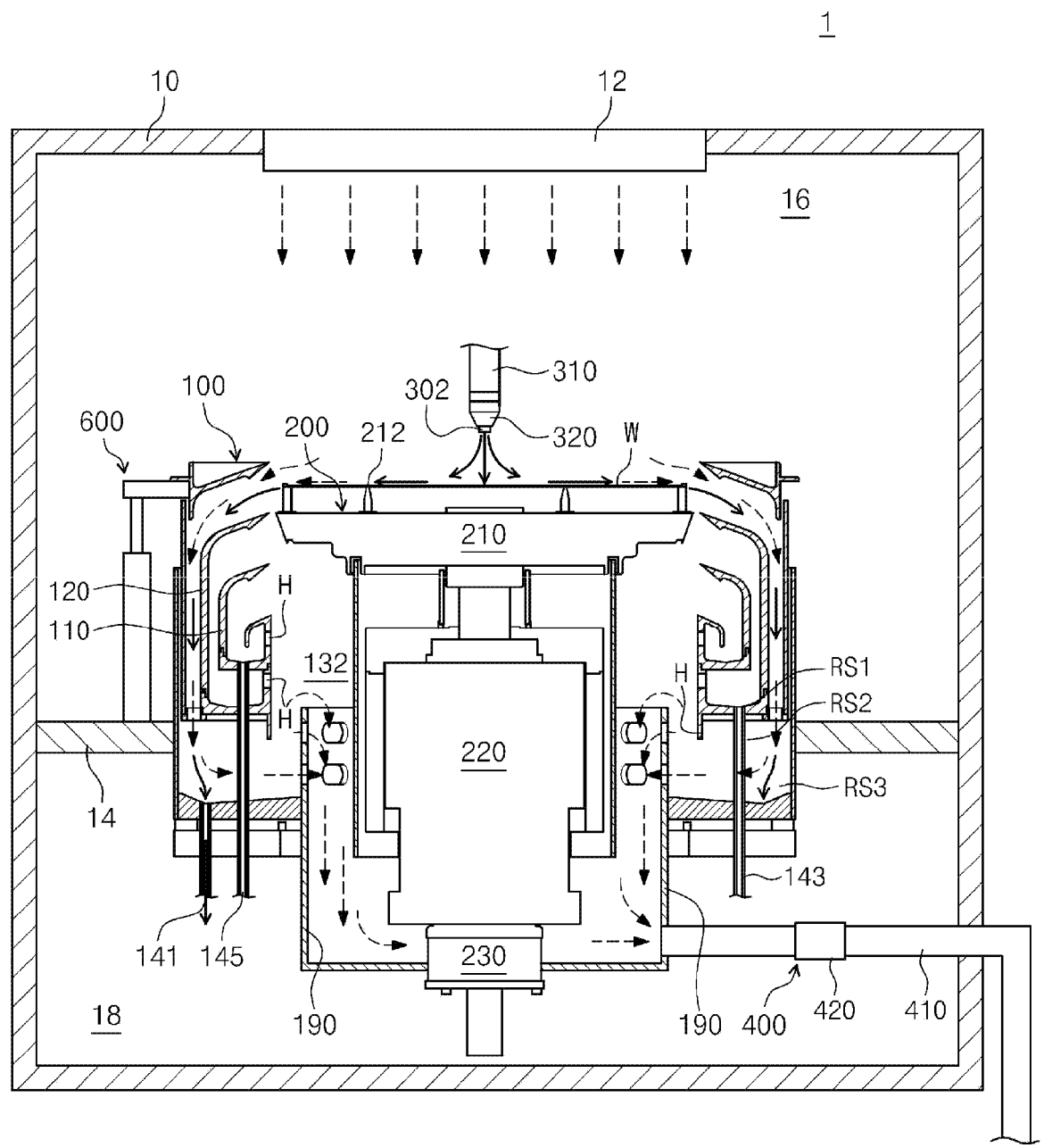
FIG. 13 is a cross-sectional view illustrating a processing container and a support module in the substrate processing apparatus shown in FIG. 12.

FIG. 12 is a plan block diagram showing the configuration of a single wafer type substrate processing device according to the present invention, and FIG. 13 is a cross-sectional view showing a processing container and a support module in the substrate processing device shown in FIG. 12.

In this embodiment, a semiconductor substrate is illustrated and described as an example processed by the single wafer type substrate processing device 1, but the present invention is not limited thereto, and may be applied to various types of substrates such as liquid crystal display devices and glass substrates.

Referring to FIGS. 12 to 13, the substrate processing device 1 according to the present invention is a device for removing foreign and film substances remaining on a substrate surface using various processing fluids, and comprises a chamber 10, a processing container 100, a support module 200, a first swing nozzle unit 300, a fixed nozzle 500, a second swing nozzle unit 700 and an exhaust member 400.

The chamber 10 provides a sealed interior space, and a fan filter unit 12 is installed at the top. The fan filter unit 12 generates vertical airflow inside the chamber 10.

The fan filter unit 12 is a device, in which a filter and an air supply fan are modularized as one unit, and filters clean air to supply it into the chamber 10. Clean air passes through the fan filter unit 12 and is supplied into the chamber 10 to form a vertical air flow. The vertical air flow of the air provides a uniform air flow in the upper portion of the substrate, and contaminants (fumes) generated in the process of processing the substrate surface by the processing fluid are exhausted through the suction ducts of the processing container 100 together with air to an exhaust member 400 and removed to maintain high cleanliness inside the processing container.

The chamber 10 is divided into a process area 16 and a maintenance area 18 by horizontal partition walls 14. Although only a part is illustrated in the diagram, the maintenance area 18 is a place, where the driving unit of the lifting unit, the driving unit 300b of the first swing nozzle unit 300 and the supplying line, etc are located in addition to the discharge lines 141, 143, and 145 connected to the processing container 100 and the sub-exhaust line 410, and it is preferable that such maintenance area 18 is isolated from the process area where substrate processing is performed.

The processing container 100 has a cylindrical shape with an open top, and provides a process space for processing the substrate W. The opened upper surface of the processing container 100 is provided as a passage for taking out and carrying in of the substrate W. The support module 200 is located inside the processing container 100. The support module 200 supports the substrate W during the process, and rotates the substrate.

Referring to FIG. 13, the processing container 100 provides an upper space 132*a*, in which the spin head 210 is located, and a lower space 132*b*, which is separated from an upper space 132*a* by a spin head 210 and connected to the exhaust duct 190 at a lower end to perform forced exhaust. In the upper space 132*a* of the processing container 100, the processing fluid scattered on a rotating substrate and the annular first, second and third suction ducts 110, 120 and 130 for introducing and inhaling gases and fumes are arranged in multiple stages. The annular first, second and third suction ducts 110, 120 and 130 have exhaust ports H opening into one common annular space (corresponding to the lower space of the container). The lower space 132*b* is provided with an exhaust duct 190 connected to the exhaust member 400.

Specifically, the first to third suction ducts 110, 120, and 130 each have a bottom surface having an annular ring shape, and sidewalls extending from the bottom surface and having a cylindrical shape. The second suction duct 120 surrounds the first suction duct 110 and is spaced apart from the first suction duct 110. The third suction duct 130 surrounds the second suction duct 120 and is spaced apart from the second suction duct 120.

The first to third suction ducts 110, 120, and 130 provide first to third recovery spaces RS1, RS2, and RS3, through which gas containing the processing fluid scattered from the substrate W and fume enters in. The first recovery space RS1 is defined by the first suction duct 110, the second recovery space RS2 is defined by the separation space between the first suction duct 110 and the second suction duct 120, and the third recovery space RS3 is defined by the separation space between the second suction duct 120 and the third suction duct 130.

Each upper surface of the first to third suction ducts 110, 120, and 130 is formed of an inclined surface, in which a central portion is opened and a distance from the corresponding bottom surface gradually increases from the connected sidewall toward the opening side. Accordingly, the processing fluid scattered from the substrate W flows into the recovery spaces RS1, RS2, RS3 along the upper surfaces of the first to third suction ducts 110, 120, 130.

The first processing liquid entering into the first recovery space RS1 is discharged to the outside through the first recovery line 141. The second processing liquid entering into the second recovery space RS2 is discharged to the outside through the second recovery line 143. The third processing liquid entering into the third recovery space RS3 is discharged to the outside through the third recovery line 145.

Meanwhile, the processing container 100 is combined with the lifting unit 600, which changes the vertical position of the processing container 100. The lifting unit 600 linearly moves the processing container 100 in the vertical direction. As the processing container 100 is moved up and down, the relative height of the processing container 100 with respect to the spin head 210 is changed. When the substrate W is loaded onto the spin head 210 or unloaded from the spin head 210, the processing container 100 descends such that the spin head 210 protrudes to the upper portion of the processing container 100.

Further, when the process is in progress, the height of the processing container 100 is adjusted so that the processing liquid may be entered into the predetermined suction ducts 110, 120, and 130 according to the type of the processing liquid supplied to the substrate W. Accordingly, the relative vertical position between the processing container 100 and the substrate W is changed. Accordingly, the processing container 100 may have different types of processing liquid and contaminant gas recovered for each of the recovery spaces RS1, RS2, and RS3.

In this embodiment, the substrate processing device 1 vertically moves the processing container 100 to change the relative vertical position between the processing container 100 and the support module 200. However, the substrate processing device 1 may change the relative vertical position between the processing container 100 and the support module 200 by vertically moving the support module 200.

The substrate support member 200 is installed inside the processing container 100. The substrate support member 200 supports the substrate W during the process, and may be rotated by the driving unit 230 to be described later during the process. The substrate support member 200 has a spin head 210 having a circular upper surface, and support pins 212 and chucking pins 214 supporting the substrate W are provided on the upper surface of the spin head 210. The support pins 212 are arranged in a predetermined arrangement spaced apart from the edge of the upper surface of the spin head 210 and are provided to protrude upward from the spin head 210. The support pins 212 support the lower surface of the substrate W so that the substrate W is supported in a state spaced upward from the spin head 210. The chucking pins 214 are respectively arranged on the outer side of the support pins 212, and the chucking pins 214 are provided to protrude upward. The chucking pins 214 align the substrate W such that the substrate W supported by the plurality of support pins 212 places at the correct position on the spin head 210. During the process, the chucking pins 214 are in contact with the side portion of the substrate W to prevent the substrate W from deviating from the correct position.

A support shaft 220 supporting the spin head 210 is connected to a lower portion of the spin head 210, and the support shaft 220 is rotated by a driving unit 230 connected to the lower end thereof. The driving unit 230 may be provided as a motor or the like. As the support shaft 220 rotates, the spin head 210 and the substrate W rotate.

The exhaust member 400 is for providing exhaust pressure (suction pressure) to the first to third suction ducts 110, 120, and 130 during the process. The exhaust member 400 includes a sub-exhaust line 410 connected to the exhaust duct 190 and a damper 420. The sub-exhaust line 410 is provided with exhaust pressure from an exhaust pump (not shown) and is connected to the main exhaust line buried in the bottom space of the semiconductor production line (fab).

The fixed nozzle units 500 are fixedly installed at the top of the processing container 100 to respectively supply ultrapure water, ozone water, nitrogen gas, etc. to the center of the substrate.

In this embodiment, the first swing nozzle unit and the second swing nozzle unit may be processing liquid spraying units.

The second swing nozzle unit 700 is moved to the upper center of the substrate through the swing movement to supply a fluid for drying the substrate on the substrate. The fluid for drying may include isopropyl alcohol and hot nitrogen gas.

The first swing nozzle units 300 are located outside the processing container 100. The first swing nozzle units 300 rotates in a boom swing method, and supplies a processing fluid for washing or etching the substrate W placed on the spin head 210 (acid solution, alkaline solution, neutral solution, dry gas). As illustrated, the first swing nozzle units 300 are arranged side by side, and each of the first swing nozzle units 300 has a different length from each other according to their respective rotational radius because its distance from the processing container 100 is different.

The swing nozzles N, in which the dampers 900 and the sensors 950 are installed described with reference to FIGS. 1 to 10, may be applied to the first swing nozzle unit 300 and the second swing nozzle unit 700.

Although the embodiments of the present invention have been described with reference to the above and the accompanying drawings, those of ordinary skill in the art to which the present invention pertains could understand that the present invention may be implemented in other specific forms without changing its technical spirit or essential features. Therefore, it should be understood that the embodiments described above are illustrative in all respects and not restrictive.

REFERENCE NUMERALS

900: damper
910: electromagnet
912: first spring
920: magnet
922 second spring
950: sensor
1000: controller
1010: chemical solution supplying unit
1020: driving unit
1030: power supplying unit

What is claimed is:

1. A substrate processing apparatus comprising:
a support module that supports a substrate and is swingable;
a swing nozzle that is arranged on one side of the support module, moves in a swing manner, and sprays a chemical solution to the substrate;
a sensor arranged on one side of the swing nozzle to sense movement of the swing nozzle;
an electromagnet and a magnet installed on the other side of the swing nozzle so as to be able to adjust spacing relative to each other; and
a controller for receiving a sensing result of the sensor and performing a damping operation to the swing nozzle by providing power to the electromagnet to generate an attractive force or repulsive force between the electromagnet and the magnet.

2. The substrate processing apparatus of claim 1,
wherein the electromagnet is connected to the other side of the swing nozzle through a first spring,
wherein the magnet is connected to the other side of the swing nozzle through a second spring.

3. The substrate processing apparatus of claim 2,
wherein a distance between the electromagnet and the magnet decreases as the first spring or the second spring is bent when an attractive force is generated between the electromagnet and the magnet,
wherein a distance between the electromagnet and the magnet increases as the first spring or the second spring is bent when a repulsive force is generated between the electromagnet and the magnet.

4. The substrate processing apparatus of claim 1,
wherein the sensor is an acceleration sensor,
wherein the controller controls at least one of a frequency and an amplitude of a current provided to the electromagnet based on the acceleration sensed by the acceleration sensor.

5. The substrate processing apparatus of claim 4,
wherein a repulsive force between the electromagnet and the magnet is increased as an absolute value of an acceleration sensed by the acceleration sensor increases.

6. The substrate processing apparatus of claim 1,
wherein a first size of vibration occurs in the swing nozzle when the swing nozzle moves at a constant speed,
wherein a second size of vibration larger than the first size occurs in the swing nozzle when the swing nozzle stops.

7. The substrate processing apparatus of claim 6,
wherein the swing nozzle moves from a first position to a second position while spraying a chemical solution to the substrate,
wherein the first position corresponds to an edge of the substrate, the second position corresponds to a center of the substrate, and the swing nozzle stops at least twice between the first position and the second position.

8. The substrate processing apparatus of claim 6,
wherein a nozzle tip is arranged on the one side of the swing nozzle,
wherein the other side of the swing nozzle is connected to a nozzle shaft,
wherein the nozzle shaft is connected to a first pulley, a motor is connected to a second pulley, and the first pulley and the second pulley are connected by a timing belt.

9. The substrate processing apparatus of claim 1,
wherein the first electromagnet comprises a voice coil motor.

10. A substrate processing apparatus comprising:
a swing nozzle for spraying a chemical solution to a substrate;
an acceleration sensor arranged on one side of the swing nozzle; and
a damper that is arranged on the other side of the swing nozzle, and performs a damping operation according to an acceleration sensed by the acceleration sensor,
wherein the damper comprises,
an electromagnet connected to the other side of the swing nozzle through a first spring, and
a magnet connected to the other side of the swing nozzle through a second spring and arranged to face the electromagnet.

11. The substrate processing apparatus of claim 10,
wherein a distance between the electromagnet and the magnet decreases as the first spring or the second spring is bent, thereby reducing a damping amount of the damper when an attractive force is generated between the electromagnet and the magnet.

12. The substrate processing apparatus of claim 10,
wherein a distance between the electromagnet and the magnet increases as the first spring or the second spring is bent, thereby increasing a damping amount of the damper when a repulsive force is generated between the electromagnet and the magnet.

13. The substrate processing apparatus of claim 10,
wherein a first size of vibration occurs in the swing nozzle when the swing nozzle moves at a constant speed,
wherein a second size of vibration larger than the first size occurs in the swing nozzle when the swing nozzle stops.

14. The substrate processing apparatus of claim 13,
wherein the swing nozzle moves from a first position to a second position while spraying a chemical solution to the substrate,
wherein the first position corresponds to an edge of the substrate, the second position corresponds to a center of the substrate, and the swing nozzle stops at least twice between the first position and the second position.

15. A method for operating a substrate processing apparatus comprising:
providing a substrate processing apparatus including a swing nozzle, an acceleration sensor arranged on one side of the swing nozzle to sense movement of the swing nozzle, an electromagnet connected to the other side of the swing nozzle through a first spring, and a magnet connected to the other side of the swing nozzle through a second spring and arranged to face the electromagnet,
sensing a vibration of the swing nozzle through the acceleration sensor, and
generating a repulsive force between the electromagnet and the magnet to increase a distance between the electromagnet and the magnet according to a sensing result of the acceleration sensor.

16. The method for operating a substrate processing apparatus of claim 15,
wherein a first size of vibration occurs in the swing nozzle when the swing nozzle moves at a constant speed,
wherein a second size of vibration larger than the first size occurs in the swing nozzle when the swing nozzle stops.

17. The method for operating a substrate processing apparatus of claim 16,
wherein the swing nozzle moves from a first position to a second position while spraying a chemical solution to the substrate,
wherein the first position corresponds to an edge of the substrate, the second position corresponds to a center of the substrate, and the swing nozzle stops at least twice between the first position and the second position.

* * * * *